US006844603B2

(12) United States Patent
Georgakos et al.

(10) Patent No.: US 6,844,603 B2
(45) Date of Patent: Jan. 18, 2005

(54) NONVOLATILE NOR TWO-TRANSISTOR SEMICONDUCTOR MEMORY CELL AND ASSOCIATED NOR SEMICONDUCTOR MEMORY DEVICE AND METHOD FOR THE FABRICATION THEREOF

(75) Inventors: Georg Georgakos, Fraunberg (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 214 days.

(21) Appl. No.: 10/314,177

(22) Filed: Dec. 6, 2002

(65) Prior Publication Data

US 2003/0109099 A1 Jun. 12, 2003

Related U.S. Application Data

(63) Continuation of application No. PCT/DE01/02069, filed on Jun. 1, 2001.

(30) Foreign Application Priority Data

Jun. 6, 2000 (DE) .......................................... 100 28 422

(51) Int. Cl.[7] .............................................. H01L 29/76
(52) U.S. Cl. ...................... 257/401; 257/231; 257/259; 257/314; 257/315; 257/390
(58) Field of Search ................................ 257/314, 315, 257/401, 231, 259, 390; 365/185.18, 185.05, 185.01

(56) References Cited

U.S. PATENT DOCUMENTS

| 4,198,649 A | * | 4/1980 | Berry .......................... 257/516 |
| 5,610,858 A | | 3/1997 | Iwahashi |
| 5,867,429 A | | 2/1999 | Chen et al. |
| 6,084,274 A | * | 7/2000 | Mukai et al. ................ 257/390 |
| 6,212,102 B1 | * | 4/2001 | Georgakos et al. ..... 365/185.18 |
| 6,291,853 B1 | * | 9/2001 | Io ............................... 257/315 |

FOREIGN PATENT DOCUMENTS

WO 99/19880 4/1999

* cited by examiner

Primary Examiner—Michael S. Lebentritt
Assistant Examiner—Doug Menz
(74) Attorney, Agent, or Firm—Laurence A. Greenberg; Werner H. Stemer; Ralph E. Locher

(57) ABSTRACT

The invention relates to a nonvolatile NOR two-transistor semiconductor memory cell, an associated semiconductor memory device and a method for the fabrication thereof, in which one-transistor memory cells are located in an active region formed in annular fashion and are driven via associated word lines. In this case, the source regions of the one-transistor memory cells are connected via a source line, while the drain regions are connected via corresponding drain lines. A reduced space requirement for the two-transistor semiconductor memory cell is obtained in particular on account of the annular structure of the active regions.

11 Claims, 8 Drawing Sheets

ND TWO-TRANSISTOR
NONVOLATILE NOR TWO-TRANSISTOR SEMICONDUCTOR MEMORY CELL AND ASSOCIATED NOR SEMICONDUCTOR MEMORY DEVICE AND METHOD FOR THE FABRICATION THEREOF

CROSS-REFERENCE TO RELATED APPLICATION

This application is a continuation of copending International Application No. PCT/DE01/02069, filed Jun. 1, 2001, which designated the United States and was not published in English.

BACKGROUND OF THE INVENTION

Field of the Invention

The present invention relates to a nonvolatile NOR two-transistor semiconductor memory cell, an associated NOR semiconductor memory device and a corresponding fabrication method. The invention relates, in particular, to a flash EPROM (Erasable Programmable Read Only Memory) memory with a "common-source" architecture or SNOR architecture, in which respective source and drain lines can be driven selectively.

At the present time, computer units or computers generally use magnetic disk drives for storing relatively large volumes of data. However, such disk drives require a relatively large space and have a multiplicity of moving parts. Consequently, they are prone to faults and have considerable current consumption. Furthermore, future computer units or computers and other digital devices such as, for example, digital cameras, music reproduction devices, or palm devices or PTAs will become smaller and smaller, for which reason conventional mechanical storage devices are unsuitable.

As an alternative to such conventional mechanical storage devices, nonvolatile semiconductor memory devices have recently gained increasing acceptance. These devices are known, for example, as flash memory, $E^2$PROM (Electrically Erasable Programmable Read Only Memory), EPROM and the like. The so-called NAND and NOR semiconductor memory devices are known as the most important representatives of such electrically erasable and electrically programmable memory devices. In both semiconductor memory devices, the memory cells have so-called one-transistor memory cells. A drain region and a source region are usually formed in an active region of a semiconductor substrate. An insulated charge-storing layer, such as e.g. a floating gate, is situated above the channel section that lies between the source and the drain. An insulated control layer is also situated above the channel section. To program such a one-transistor memory cell, relatively high voltages are applied to the control layer and to the drain region. Under such circumstances, charge carriers are introduced into the charge-storing layer by channel injection, injection of hot charge carriers, and/or Fowler-Nordheim tunneling. In this case, the charge carriers remain in the charge-storing layer and effect a lasting change in the switching behavior of the respective field-effect transistor.

Whereas in NAND semiconductor memory devices a multiplicity of one-transistor memory cells are serially connected to one another and are driven via a common selection gate or a selection transistor, the respective one-transistor memory cells in NOR semiconductor memory devices are organized in parallel or in matrix form, as a result of which each memory cell can be selected individually.

The present invention relates exclusively to such NOR semiconductor memory devices.

FIG. 1 shows a simplified illustration of an equivalent circuit diagram of a prior art nonvolatile NOR semiconductor memory device with so-called "common-source" architecture. In accordance with FIG. 1, a multiplicity of one-transistor memory cells T1, T2, . . . are arranged in matrix form, i.e. in rows and columns. As has already been described above, each one-transistor memory cell T1, T2, . . . includes mutually spaced-apart drain and source regions D and S, which are formed in an active region of a semiconductor substrate. In this case, a control layer CG (control gate) is respectively connected row by row to an associated word line WL1, WL2, WL3, . . . By contrast, the drain regions D of the respective one-transistor memory cells T1, T2, . . . are connected column by column to a respective bit line BL1, BL2, . . . The source regions S of the nonvolatile NOR semiconductor memory device are all grounded or are all connected to one another, which is why such a NOR semiconductor memory device is referred to as a memory device with "common source" architecture.

However, in addition to the relatively high current consumption during a programming operation, a limited integration possibility is disadvantageous in the case of such a conventional semiconductor memory device. More precisely, in the event of further-reaching integration or miniaturization of the cell structures, the shortening of the cell transistors or of the channel regions has the effect that the cell transistor can no longer block the programming voltage applied on the bit line BL1, BL2, as a result of which, a short circuit to the source or to ground is produced.

So-called SNOR semiconductor memory devices (selective NOR) have been used in order to avoid such short circuits or undesirable leakage currents. Selective driving of the respective source and drain regions of the one-transistor memory cells is made possible, and consequently, the high voltage drop arising during the programming operation can be reduced in a targeted manner.

FIG. 2 shows a simplified illustration of such a nonvolatile SNOR semiconductor memory device. Identical reference symbols designating identical or similar elements and their repeated description is dispensed with below.

In contrast to the above-described NOR semiconductor memory device with "common source" architecture, the one-transistor memory cells T1, T2, . . . in accordance with FIG. 2 can be selectively driven via a respective source line SL1, SL2, . . . and via a respective drain line DL1, DL2, . . . This selective driving is carried out, for example, via respective bit line controls BLC that are realized by the common bit lines BL1, BL2, . . . In this way, it is possible to carry out further "shrinks" or further-reaching integration of the semiconductor memory device since the SNOR architecture does not rely on a predetermined minimum cell transistor length or channel length.

FIG. 3 shows a simplified illustration of a layout of the SNOR semiconductor memory device in accordance with FIG. 2. In accordance with FIG. 3, the one-transistor memory cells T1, T2, . . . are formed in active regions AA of a semiconductor substrate, which have an essentially strip-type structure. The multiplicity of strip-type active regions AA arranged in columns have superposed on them, in rows, layer stacks that are likewise formed in strip form—a topmost layer constituting the control layer or word line WL1, WL2, WL3, . . . of the one-transistor memory cells T1, T2, . . . Each crossover point or overlap region between such a strip-type active region AA and a word line WL1, WL2, WL3, . . . formed in strip form thus represents, together with a charge-storing layer situated underneath, a field-effect transistor or a one-transistor memory cell. In order to make contact with respective drain regions D and source regions S, contacts K are formed which are formed essentially on the active region AA but can also reach into an adjoining insulation region STI (shallow trench isolation). The source lines SL1, SL2, . . . and the drain lines DL1, DL2, . . . are then situated in a further overlying layer, which preferably constitutes a first metalization layer. In this case, the drain lines DL1, DL2 are connected via corresponding contacts K to the associated drain regions D of the active region, the source lines SL1, SL2 being connected in the same way via corresponding contacts K to the associated source regions S.

What is disadvantageous about this layout, however, is that the additional source lines SL1, SL2, . . . mean that a metalization is present which is more than twice as intensive as compared with a layout of the "common-source" NOR architecture, which in turn constitutes a limiting factor for further-reaching integration or further "shrinks".

SUMMARY OF THE INVENTION

It is accordingly an object of the invention to provide a nonvolatile NOR two-transistor semiconductor memory cell, an associated NOR semiconductor memory device and a method for the fabrication thereof which overcome the above-mentioned disadvantages of the prior art apparatus and methods of this general type.

In particular, it is an object of the invention to improve the space requirement for a metalization and contact-connection and to enable the possibility for a simplified integration.

In particular, using active regions formed essentially in an annular fashion makes it possible to halve the number of contacts, thereby significantly relieving a metalization for the source and drain lines. As a result, the NOR two-transistor semiconductor memory cell can be compacted in the column direction, thereby furthermore improving a coupling factor resulting from a capacitance ratio of the charge-storing layer/active region and the charge-storing layer/control layer. Furthermore, complete compatibility with the SNOR and common-source architectures already known is produced.

With the foregoing and other objects in view there is provided, in accordance with the invention, a nonvolatile NOR two-transistor semiconductor memory cell including: a semiconductor substrate having an active region formed therein; a first memory transistor having a drain region and a source region; a second memory transistor having a drain region and a source region; a first word line for driving the first memory transistor; a second word line for driving the second memory transistor; a source line for connection with the source region of the first memory transistor and the source region of the second memory transistor; and a drain line for connection with the drain region of the first memory transistor and the drain region of the second memory transistor. Importantly, the active region is formed essentially annularly.

In accordance with an added feature of the invention, there is provided, a first charge-storing layer for storing charges, the first charge-storing layer formed at an overlap region where the first word line overlaps the active region to form the first memory transistor; a second charge-storing layer for storing charges, the second charge-storing layer formed at an overlap region where the second word line overlaps the active region to form the second memory transistor; a first nonlinear resistor formed at another overlap region where the first word line overlaps the active region; and a second nonlinear resistor formed at another overlap region where the second word line overlaps the active region.

With the foregoing and other objects in view there is provided, in accordance with the invention, a NOR semiconductor memory device including a plurality of the above-described nonvolatile two-transistor semiconductor memory cells configured in a matrix form. The active regions of the memory cells are configured in the form of columns.

In accordance with an added feature of the invention, the drain line and the source line are selectively driven.

In accordance with an additional feature of the invention, the source line of each one of the plurality of the memory cells are jointly connected to one another; and only the drain line of each one of the plurality of the memory cells is selectively driven.

In accordance with another feature of the invention, the drain line and the source line of each one of the plurality of the memory cells are configured in a strip form, a meandering form, a zigzag form, or an undulating form.

In accordance with a further feature of the invention, there is provided, a common electrically conductive layer having the source line and the drain line formed therein.

In accordance with a further added feature of the invention, there is provided, a first electrically conductive layer having the source line formed therein; and a second electrically conductive layer having the drain line formed therein.

In accordance with a further additional feature of the invention, there is provided, the source line and the drain line are configured essentially parallel to one another and/or in an overlapping fashion.

With the foregoing and other objects in view there is provided, in accordance with the invention, a method for fabricating a nonvolatile NOR two-transistor semiconductor memory cell. The method includes steps of: forming an annular active region in a semiconductor substrate; forming a first insulation layer at a surface of the semiconductor substrate; forming a charge-storing layer at a surface of the first insulation layer; forming implantation openings in the charge-storing layer at predetermined regions of the active region; performing an implantation to form a shallow implantation region in the predetermined regions of the active region; forming a second insulation layer at a surface of the charge-storing layer and at the surface of the semiconductor substrate; forming strip-type first conductive layers at a surface of the second insulation layer; removing the second insulation layer and the charge-storing layer using the strip-type first conductive layer as a mask; forming self-aligned drain and source regions in the active region using the strip-type first conductive layer as a mask; forming contacts in the active region; and forming a strip-type second conductive layer for realizing source lines and drain lines.

In accordance with an added mode of the invention, the step of performing the implantation includes performing an inclined implantation to obtain an adequate doping in edge regions of the shallow implantation region.

Other features which are considered as characteristic for the invention are set forth in the appended claims.

Although the invention is illustrated and described herein as embodied in a nonvolatile NOR two-transistor semiconductor memory cell and associated NOR semiconductor memory device and method for the fabrication thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
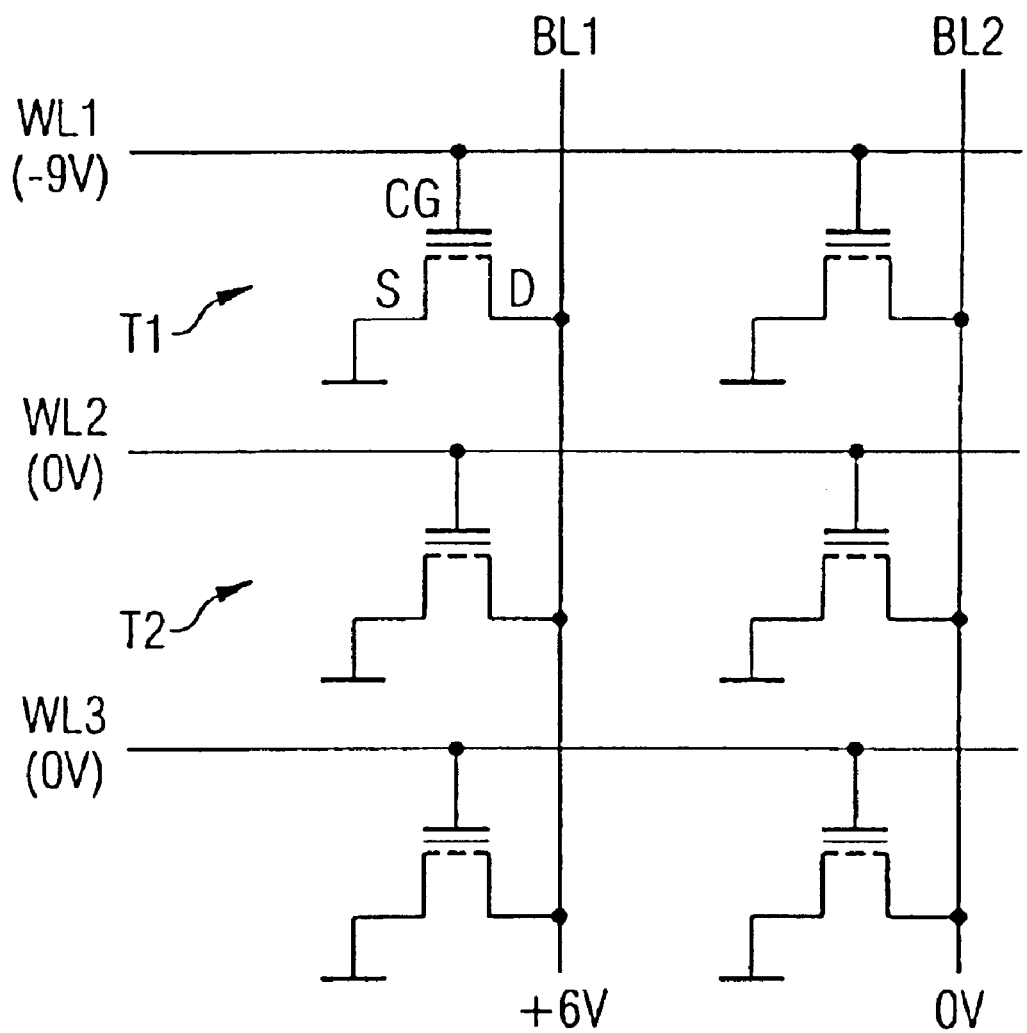
FIG. 1 is a simplified illustration of an equivalent circuit diagram of a prior art nonvolatile NOR semiconductor memory device with "common-source" architecture.
Figure 2:
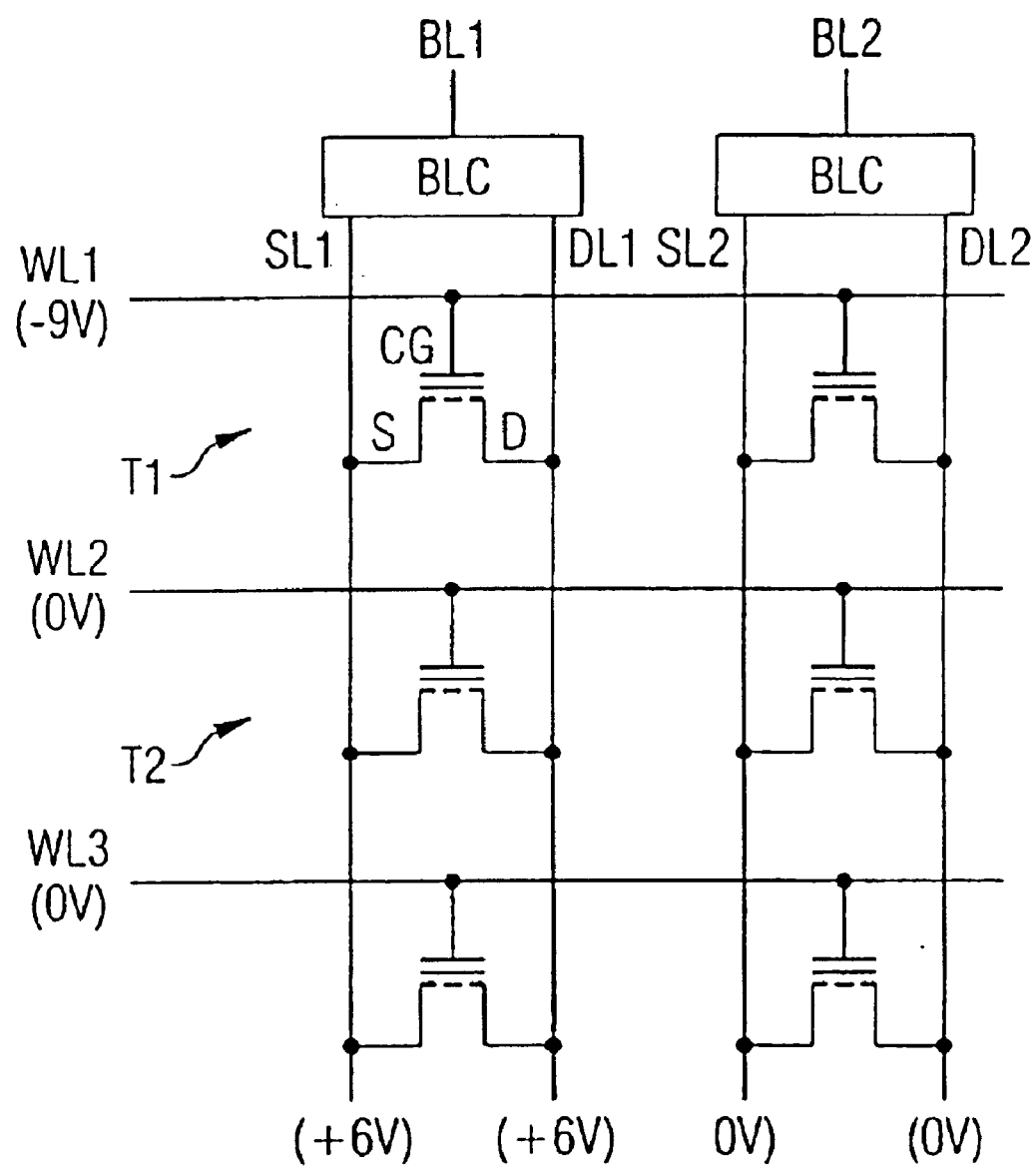
FIG. 2 is a simplified illustration of an equivalent circuit diagram of a prior art nonvolatile SNOR semiconductor memory device.
Figure 3:
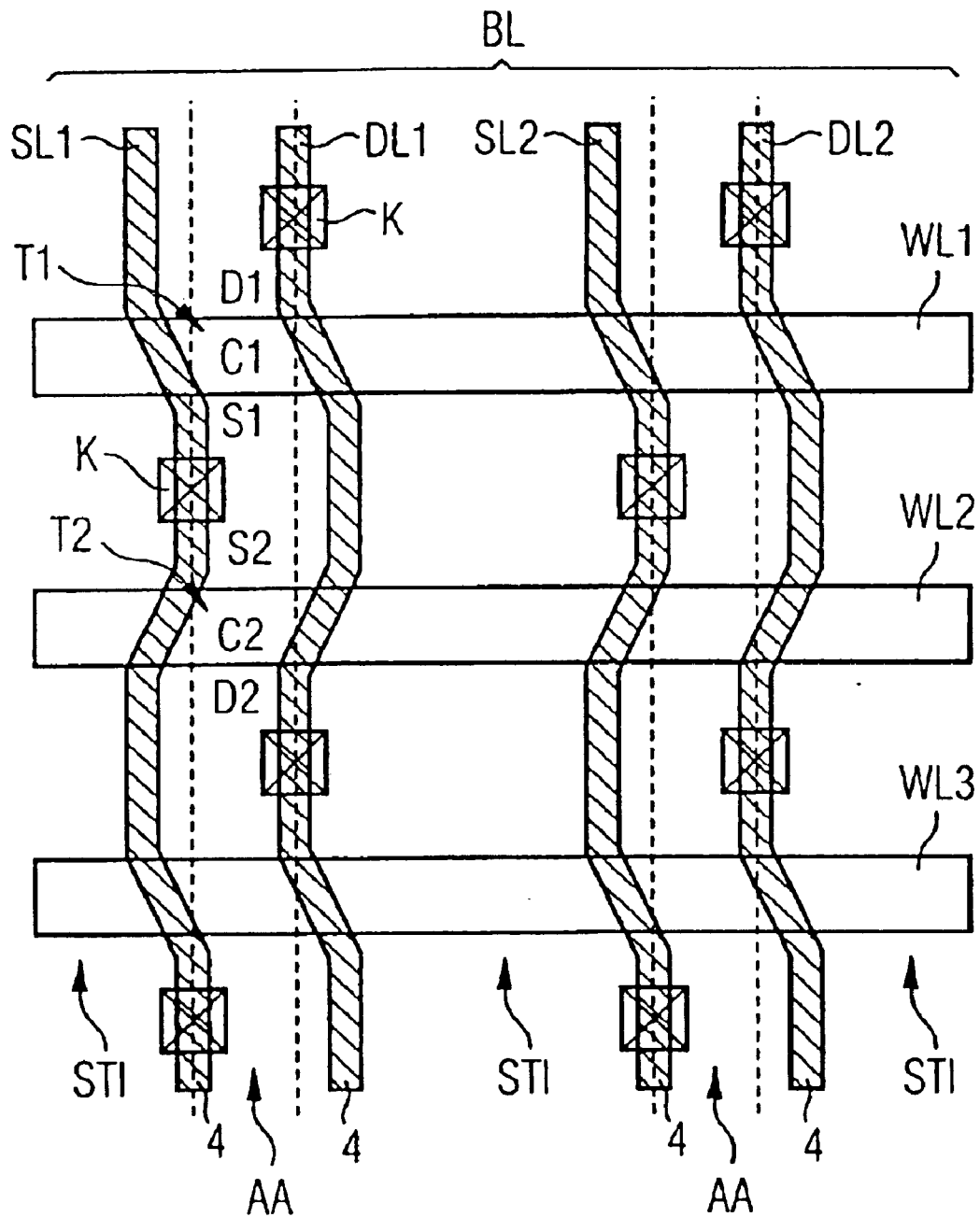
FIG. 3 is a simplified illustration of a layout of the SNOR semiconductor memory device shown in FIG. 2.
Figure 4:
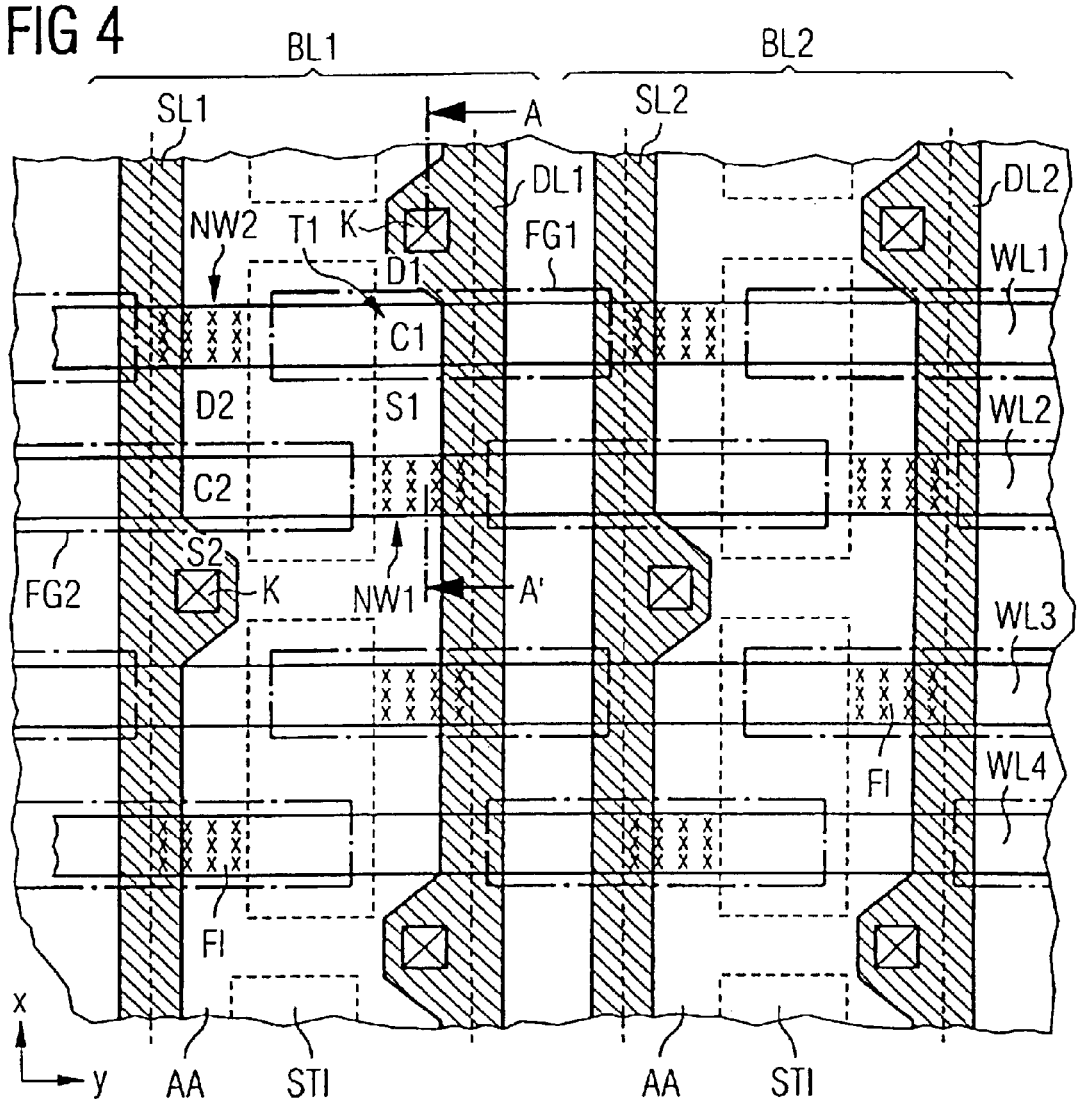
FIG. 4 is a simplified illustration of a layout of a first exemplary embodiment of the NOR semiconductor memory device.

Referring now to the figures of the drawing in detail and first, particularly, to FIG. 4 thereof, there is shown a simplified illustration of a layout of a first embodiment of a NOR semiconductor memory device. Identical reference symbols designate elements identical or similar to those shown in FIG. 3, and a repeated description therefore is dispensed with below.

In accordance with FIG. 4, active regions AA now include regions that are formed essentially in an annular fashion and are lined up in respective columns one below the other. A multiplicity of such annular active regions, which is required for forming a respective nonvolatile NOR two-transistor semiconductor memory cell, thus produce a ladder-type structure. The annular active region AA is preferably produced by forming shallow isolation trenches STI (shallow trench isolation) in a semiconductor substrate. However, it is also possible to use any further insulation for forming the active regions AA.

In each case a drain region D1 and D2, a source region S1 and S2 and a channel region C1 and C2 are formed in each annular active region AA in order to form two one-transistor memory cells T1 and T2. The one-transistor memory cells T1 and T2 are preferably situated at centrosymmetrically opposite locations of the active region AA formed essentially in annular fashion.

For driving the first one-transistor memory cell or the first memory transistor T1, a first word line WL1 is situated essentially above the channel region C1, and it also extends over adjacent annular active regions which are in have a column form. In the same way, a second word line WL2 for driving the second one-transistor memory cell or the second memory transistor T2 extends above a channel region C2 and also over channel regions of adjacent active regions AA. In a similar manner, word lines WL3 and WL4 drive further one-transistor memory cells or memory transistors in further annular active regions, as a result of which it is possible to realize targeted driving of the one-transistor memory cells or memory transistors arranged in matrix form. The word lines WL1 to WL4 preferably include polysilicon, but may also include any other electrically conductive layer. Furthermore, mutually isolated charge-storing layers FG1, FG2, etc. are situated below the word lines in order to realize the memory effect.

In order to make contact with the respective source and drain regions, in accordance with FIG. 4, contacts K are preferably situated in each corner region of the active region AA formed in annular fashion. In this case, the contacts K are connected in an overlying conductor plane or metalization via source lines SL1, SL2, etc. and drain lines DL1, DL2, . . . , thereby producing bit line driving of the respective one-transistor memory cells or memory transistors. In the case of the SNOR semiconductor memory device illustrated in FIG. 4, a respective source and drain line pair SL1, DL1 and SL2, DL2 in each case represents a bit line BL1 and BL2.

Since, on account of the annular structure of the active regions AA, the word lines WL1 to WL4 intersect or overlap the latter twice, in accordance with FIG. 4. In order to avoid a further field-effect transistor structure or a further memory transistor, this further point of intersection or overlap region is formed in such a way that it does not have a charge-storing layer FG1 or FG2. Furthermore, the active region AA is treated, below these overlap regions, in such a way that a conductive region FI (e.g. shallow implantation region) is formed. This conductive region is preferably formed by the implantation of charge carriers, as a result of which a nonlinear resistor NW1 and NW2 can be realized.

In this way, it is possible on the one hand to significantly simplify the structure of the source and drain lines SL1, SL2, and DL1 and DL2, since they can now be formed essentially in strip form. This means a significant simplification of the metalization masks used for the source and drain lines. Furthermore, the annular structure of the active regions AA enables the number of contacts K to be significantly reduced, in particular compared with an SNOR architecture. In this way, a requisite space requirement is reduced, in particular in the x-direction. However, the reduction of contacts K also enables a further reduction of a space requirement in the y-direction, since the respective source and drain lines can be pushed together using zigzag, meandering or overlapping structures.

An essential advantage of the annular active regions AA also results for a coupling factor which essentially constitutes a ratio of the capacitance between the channel region (semiconductor substrate) and the charge-storing layer FG and the capacitance between the charge-storing layer FG and the control layer. The coupling factor is of importance in particular for reading or writing charges from the one-transistor memory cell, since an improved coupling significantly reduces the required programming voltages, and consequently, corresponding voltage generator circuits (not illustrated) can be further simplified and miniaturized.

Consequently, in accordance with FIG. 4, the area of the charge-storing layer FG1 and FG2 is not reduced in conjunction with a reduced cell area, but can even be enlarged, thereby producing an improved coupling factor.

Figure 5:
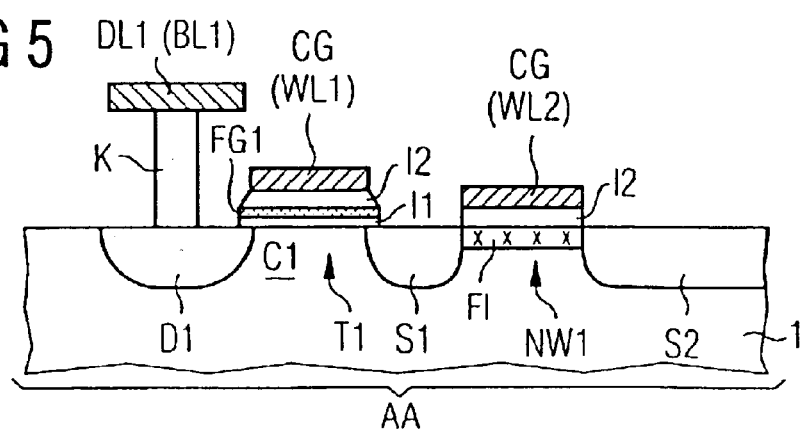
FIG. 5 is a simplified cross-sectional view taken along the section line A/A' in FIG. 4.

FIG. 5 shows a simplified sectional view taken along the section line A/A' shown in FIG. 4. In this case, the reference symbol 1 designates a semiconductor substrate which preferably has silicon and represents a part of the active region AA formed in an annular fashion. A drain region D1, a channel region C1, a source region S1 and a source region S2 are formed in the active region AA or semiconductor substrate 1. In this case, the drain region D1 is connected via a contact K to the drain line DL1, which is situated in an overlying electrically conductive layer. The drain line DL1 and also a source line SL1 (not illustrated) are preferably situated in a first metalization layer.

In order to form the first memory transistor or the first one-transistor memory cell T1, in accordance with FIG. 5, a first insulation layer I1 is situated above the channel region C1, which layer is preferably formed as a tunnel insulation layer and is composed of $SiO_2$, for example. The charge-storing layer FG1 (floating gate) which, however, may also include a multiplicity of charge-storing layers, is situated on the tunnel insulation layer I1 for the purpose of storing the charges introduced by channel injection, injection of hot charge carriers and/or Fowler-Nordheim tunneling. For the driving of the one-transistor memory cell T1, a control layer CG is situated in a manner insulated from the charge-storing layer FG1 by a second insulation layer I2. The control layer is formed from the word line WL1 in accordance with FIG. 4. Since the annular structure of the active region AA means that each word line has a second overlap region with the active region, this second overlap region is made electrically conductive, for example in the course of the C9 process used by Infineon Technologies, by implantation in order to form a shallow implantation region or conductive region FI as a result of which the nonlinear resistor NW1 is formed. Accordingly, the overlying control layer CG of the word line WL2 does not significantly affect the current flow between the source region S1 and the source region S2. In the case where other processes are used, however, the nonlinear resistor NW1 may also be fabricated differently—only the electrically conductive connection between the source regions S1 and S2 are of importance.

Figure 6:
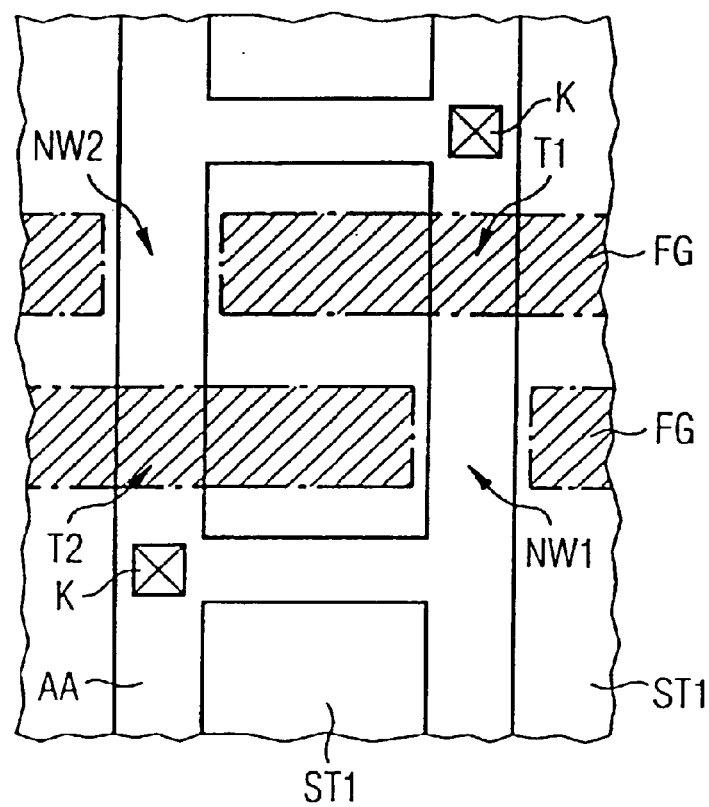
FIG. 6 is an enlarged and further simplified illustration of the layout of a NOR two-transistor semiconductor memory cell shown in FIG. 4.

FIG. 6 shows a further simplified partial illustration of FIG. 4 in order to illustrate a NOR two-transistor semiconductor memory cell according to the invention. To allow a clearer illustration, the illustration of the word lines and also source and drain lines has deliberately been dispensed with here.

In accordance with FIG. 6, the inventive NOR two-transistor semiconductor memory cell includes an active region AA which is formed in annular fashion and is preferably formed via shallow trench isolation STI in the semiconductor substrate. In order to produce electrical terminals for the drain and source regions, contacts K are preferably situated in opposite corner regions of the active region AA. However, the contacts K may also be arranged in the center of the upper and lower transverse webs or at some other location of the active region AA. In order to simplify the fabrication of the two-transistor semiconductor memory cell, the charge-storing layers FG are preferably situated directly below the word lines (not illustrated), which means that self-aligning methods can be used. In this case, the one-transistor memory cells T1 and T2 are each formed at the overlap regions with the active region AA, the interruptions—required anyway—for the respective charge-storing layers FG being formed directly at a respective second overlap region. In this way, the above-described electrically conductive regions FI in the active region or the nonlinear resistors NW1 and NW2 can likewise be formed in a self-aligning manner.

Figure 7:
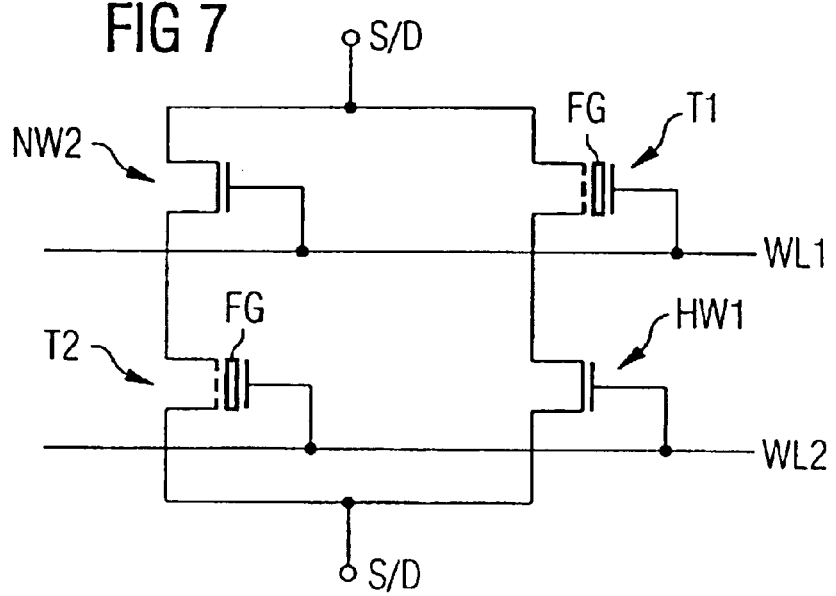
FIG. 7 is a simplified illustration of an equivalent circuit diagram of the nonvolatile NOR two-transistor semiconductor memory cell.

FIG. 7 shows a simplified illustration of an equivalent circuit diagram of the nonvolatile NOR two-transistor semiconductor memory cell in accordance with FIG. 6—with identical reference symbols designating identical or similar elements to those already described. Accordingly, in the case of the annular structure of the active region AA, two one-transistor memory cells T1 and T2 are situated in respectively opposite regions and can be driven selectively via the word lines WL1 and WL2 and the source/drain terminals S/D. In this case, the charge respectively stored in the charge-storing layer FG determines the information content of the one-transistor memory cells T1 and T2. In the case where the Infineon C9 process is used, the nonlinear resistors NW1 and NW2 are produced, moreover, which in each case realize a conductive connection from the source/drain terminals S/D to the one-transistor memory cells T1 and T2. In the case where other processes are used, however, it is possible, for example, by changing a layer thickness of the second insulation layer I2, to reduce the influence of the respective word line on the underlying channel region of the nonlinear resistors in such a way that they constitute voltage-independent linear resistors. In this case, a field-effect transistor function is precluded at the further overlap regions.

Figure 8:
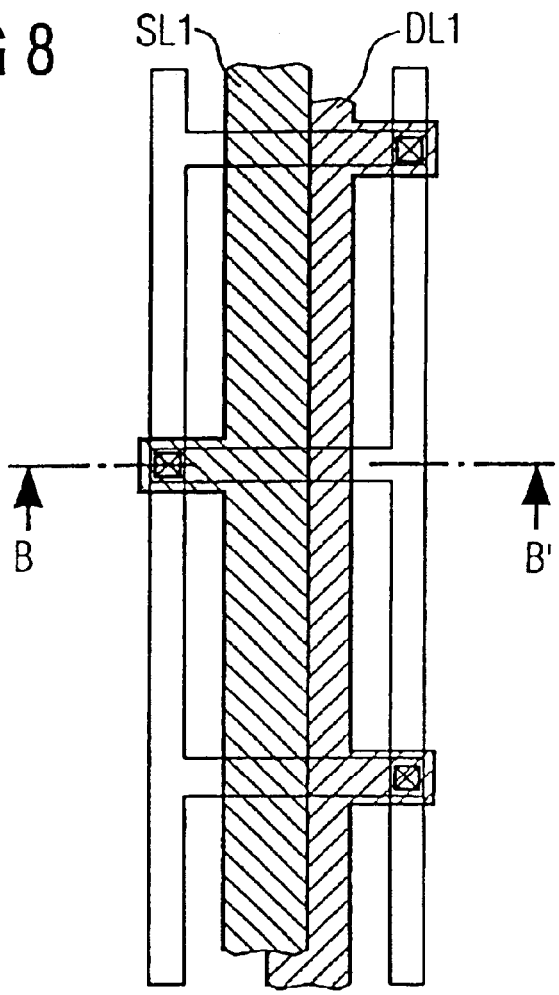
FIG. 8 is a simplified illustration of a layout of a second exemplary embodiment of the NOR semiconductor memory device.

FIG. 8 shows a simplified illustration of a layout of a second embodiment of the NOR semiconductor memory device—identical reference symbols again designating identical or similar elements. In order to simplify the illustration, in this case the word lines WL1, . . . and the charge-storing layers FG1, . . . have been dispensed with and only a column of two-transistor semiconductor memory cells has been illustrated.

In accordance with FIG. 8, the source and drain lines formed in the same electrically conductive layer in FIG. 4 can also be formed in different electrically conductive layers, as a result of which it is possible to achieve a further compaction or reduction of a space requirement. In this case, the source and drain lines SL1 and DL1 are arranged essentially parallel to one another and have a strip-type structure. However, they may also be formed in meandering, zigzag or undulating form, in which case they run parallel to one another or partly overlap.

Figure 9:
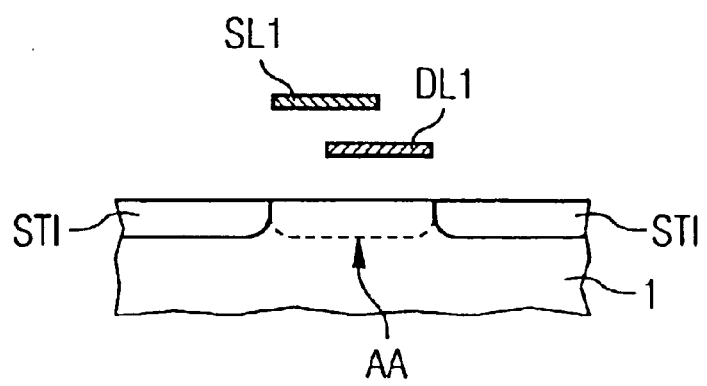
FIG. 9 is a simplified cross-sectional view taken along the section line B/B' shown in FIG. 10.

FIG. 9 shows a simplified sectional view taken along the section line B/B' in FIG. 8. In this case, an active region AA is formed in the semiconductor substrate 1 by suitable isolation STI. In accordance with FIG. 9, the drain line DL1 is now situated in a first conductive layer or metalization layer and the source line SL1 is situated in a second conductive layer or metalization layer, in which case the metalization layers may partly overlap and be spaced apart from one another by an insulation layer (not illustrated). This yields a further significant reduction of the cell area for the NOR two-transistor semiconductor memory cell and thus for the entire NOR semiconductor memory device.

A method for fabricating the above-described NOR two-transistor semiconductor memory cell and the associated NOR semiconductor memory device is described below with reference to the essential method steps. In accordance with FIG. 10 and FIG. 5 first, annular active regions AA are formed in a semiconductor substrate, which regions preferably adjoin one another in the x-direction and are electrically connected to one another. Afterward, a first insulation layer I1 is formed in a further method step, which layer is used as a tunnel oxide layer and is preferably composed of a thermally formed silicon dioxide. After the formation of the first insulation layer I1, a charge-storing layer FG is deposited, for example, as an electrically conductive polysilicon layer, over the whole area of the semiconductor substrate 1, and in a subsequent step, implantation openings O are formed in the charge-storing layer FG in such a way that they are located at predetermined regions of the active region AA at which the nonlinear resistors NW1, NW2, . . . are later formed. The corresponding FG mask is illustrated in detail in FIG. 10.

Figure 10:
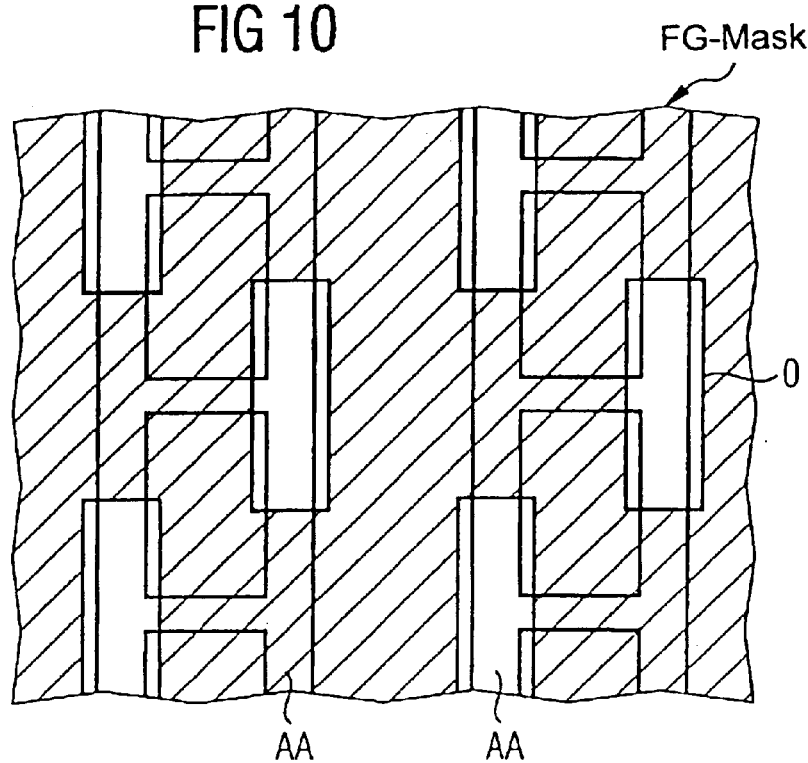
FIG. 10 is a simplified illustration of a first mask layer used during the fabrication of the first exemplary embodiment of the NOR semiconductor memory device.
Figure 11:
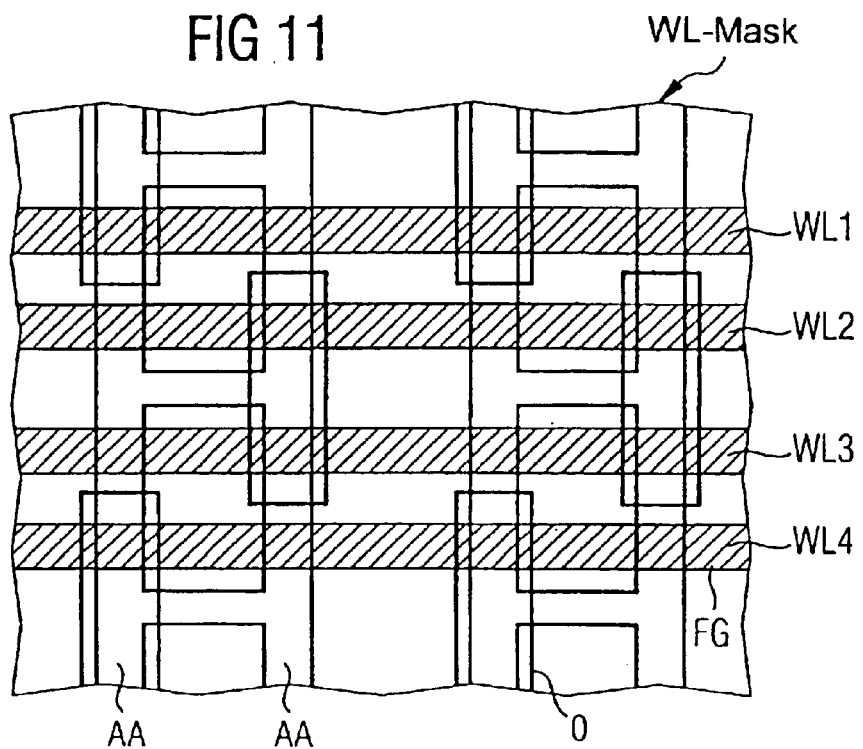
FIG. 11 is a simplified illustration of a further mask layer used during the fabrication of the first exemplary embodiment of the NOR semiconductor memory device.

Using the FG mask illustrated in FIG. 10, implantation of charge carriers is carried out in order to form a shallow implantation region FI in the predetermined regions of the active region AA. In this way, predetermined regions of the annular active region AA become electrically conductive. In a further method step, a second insulation layer I2 is subsequently formed at the surface of the charge-storing layer FG and of the semiconductor substrate 1, which essentially serves as an insulation layer between subsequently formed word lines WL1, . . . and the charge-storing layer FG. In a subsequent step, a first conductive layer (e.g. polysilicon) is formed over the whole area at the surface of the second insulation layer I2 in order to realize the word lines WL1, WL2, . . . and is covered with a word line mask WL mask illustrated in FIG. 11. In a subsequent step, sections of the first conductive layer CG, of the second insulation layer I2 and of the charge-storing layer FG are removed using the strip-type WL mask, so-called sandwich etching, thereby forming the respective strip-type word lines WL1, WL2, . . . and underlying (mutually isolated) charge-storing layers FG1, . . . In the direction of the word lines, these charge-storing layers are isolated by the implantation openings O. Afterward, drain and source regions D and S are formed in a self-aligning manner in the active regions AA using the strip-type first conductive layer or the word lines WL1, WL2, . . . (WL mask). In a further step (not illustrated), contacts K are formed in the active region AA and overlying strip-type electrically conductive layers are formed in order to realize source and drain lines SL1, . . . and DL1, . . . , which layers run essentially perpendicular to the word lines WL1, . . . and are connected to the contacts K.

This yields a simple and cost-effective process for fabricating a highly space-saving NOR two-transistor semiconductor memory cell and the associated NOR semiconductor memory device. In particular on account of the self-aligning formation of the nonlinear resistors NW1, . . . and of the charge-storing layers FG1, . . . and of the source and drain regions S1/D1, . . . , such a method makes it possible to carry out further-reaching integration in conjunction with relatively low costs.

In particular when carrying out the implantation for forming the shallow implantation region FI in the nonlinear resistor, an inclined implantation may preferably be carried out in order to form adequate dopings in the edge regions, which is of importance in particular in the case of a slight undercut of the semiconductor substrate 1 in the active region AA. The undercut is caused by the above-described sandwich etching in the opening region O. A reliable conductive connection is thus ensured at any time.

Figure 12:
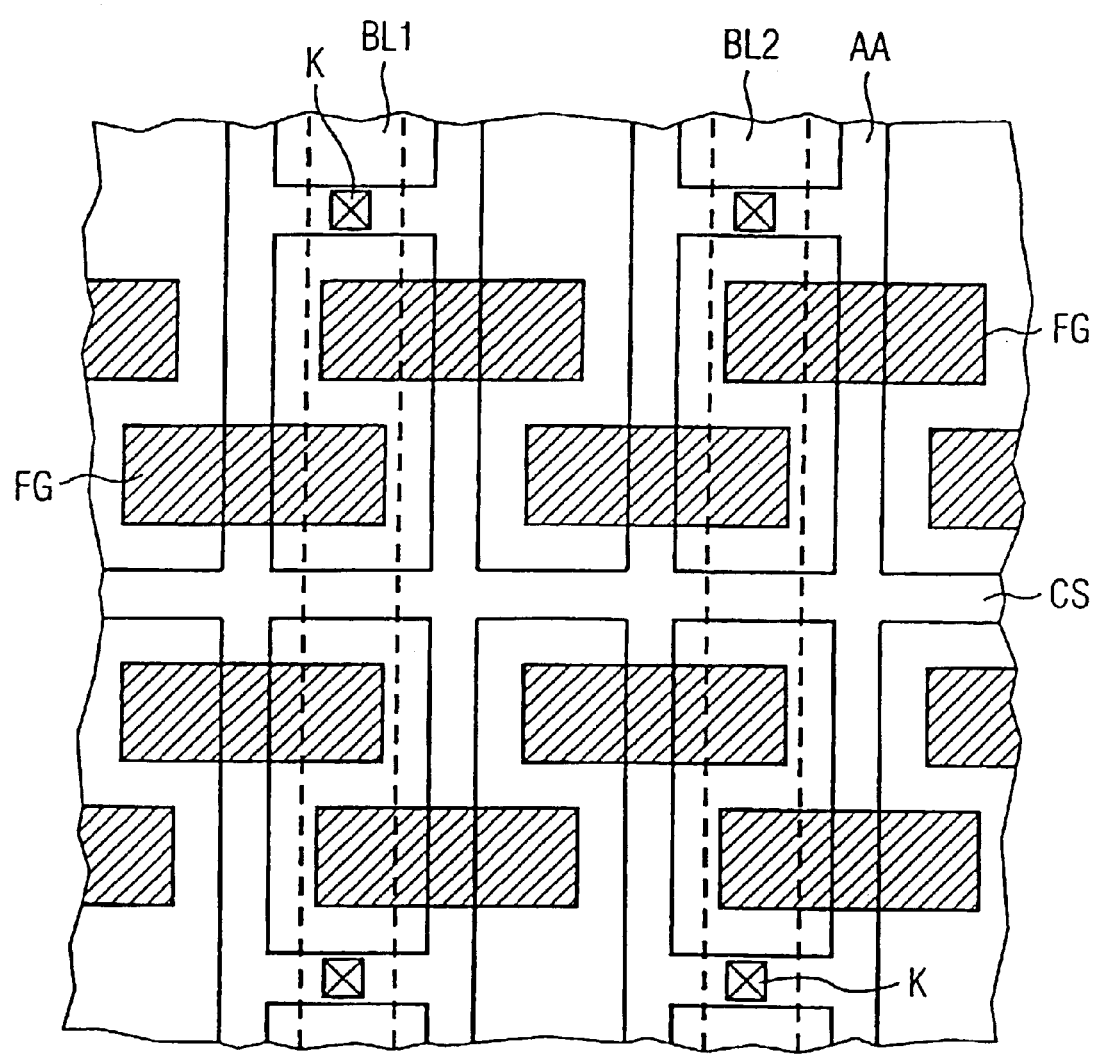
FIG. 12 is a simplified illustration of a layout of a third exemplary embodiment of the NOR semiconductor memory device.

FIG. 12 shows a simplified illustration of a layout of a third exemplary embodiment of the inventive NOR semiconductor memory device. Identical reference symbols designate identical or similar layers or elements and a detailed description has been dispensed with below. To allow a clearer illustration, the illustration of the word lines has deliberately been dispensed with here.

A NOR semiconductor memory device with so-called "common-source" architecture is illustrated in FIG. 12. Respective source regions are connected via a common source terminal CS (common source). In this case, the annular active regions (AA) are also connected column by column, thereby producing a significant simplification in the case of the metalization and reduction of the number of contacts K. In accordance with FIG. 12, each two-transistor semiconductor memory cell has only one contact K for the bit lines BL1, BL2, . . . or for the connection of the respective drain regions.

The present invention has been described using active regions with a rectangular annular structure. However, it is not restricted thereto, but rather also encompasses square, polygonal, or other structures that are essentially annular.

We claim:

1. A nonvolatile NOR two-transistor semiconductor memory cell comprising:

a semiconductor substrate having an active region formed therein;

a first memory transistor having a drain region and a source region;

a second memory transistor having a drain region and a source region;

a first word line for driving said first memory transistor;

a second word line for driving said second memory transistor;

a source line for connection with said source region of said first memory transistor and said source region of said second memory transistor; and a drain line for connection with said drain region of said first memory transistor and said drain region of said second memory transistor;

said active region formed essentially annularly.

2. The nonvolatile NOR two-transistor semiconductor memory according to claim 1, comprising:

a first charge-storing layer for storing charges, said first charge-storing layer formed at an overlap region where said first word line overlaps said active region to form said first memory transistor;

a second charge-storing layer for storing charges, said second charge-storing layer formed at an overlap region where said second word line overlaps said active region to form said second memory transistor;

a first nonlinear resistor formed at another overlap region where said first word line overlaps said active region; and a second nonlinear resistor formed at another overlap region where said second word line overlaps said active region.

3. A NOR semiconductor memory device, comprising:

a plurality of nonvolatile two-transistor semiconductor memory cells configured in a matrix form, each one of said plurality of said memory cells including:
- a semiconductor substrate having an active region formed therein;
- a first memory transistor having a drain region and a source region;
- a second memory transistor having a drain region and a source region;
- a first word line for driving said first memory transistor;
- a second word line for driving said second memory transistor;
- a source line for connection with said source region of said first memory transistor and said source region of said second memory transistor; and
- a drain line for connection with said drain region of said first memory transistor and said drain region of said second memory transistor;
- said active region formed essentially annularly;
- said active region of each one of said memory cells configured in a column form.

4. The NOR semiconductor memory device according to claim 3, wherein said drain line and said source line are selectively driven.

5. The NOR semiconductor memory device according to claim 3, wherein said source line of each one of said plurality of said memory cells are jointly connected to one another; and only said drain line of each one of said plurality of said memory cells is selectively driven.

6. The NOR semiconductor memory device according to claim 3, wherein said drain line and said source line of each one of said plurality of said memory cells are configured in a form selected from a group consisting of a strip form, a meandering form, a zigzag form, and an undulating form.

7. The NOR semiconductor memory according to claim 3, comprising a common electrically conductive layer having said source line and said drain line formed therein.

8. The NOR semiconductor memory device according to claim 3, comprising a first electrically conductive layer having said source line formed therein; and a second electrically conductive layer having said drain line formed therein.

9. The NOR semiconductor memory device according to claim 3, wherein said source line and said drain line are configured essentially parallel to one another and/or in an overlapping fashion.

10. A method for fabricating a nonvolatile NOR two-transistor semiconductor memory cell, which comprises:

forming an annular active region in a semiconductor substrate;

forming a first insulation layer at a surface of the semiconductor substrate;

forming a charge-storing layer at a surface of the first insulation layer;

forming implantation openings in the charge-storing layer at predetermined regions of the active region;

performing an implantation to form a shallow implantation region in the predetermined regions of the active region;

forming a second insulation layer at a surface of the charge-storing layer and at the surface of the semiconductor substrate;

forming strip-type first conductive layers at a surface of the second insulation layer;

removing the second insulation layer and the charge-storing layer using the strip-type first conductive layer as a mask;

forming self-aligned drain and source regions in the active region using the strip-type first conductive layer as a mask; forming contacts in the active region; and forming a strip-type second conductive layer for realizing source lines and drain lines.

11. The method according to claim 10, wherein the step of performing the implantation includes performing an inclined implantation to obtain an adequate doping in edge regions of the shallow implantation region.

* * * * *